(12) United States Patent  
Hirota (10) Patent No.: US 8,743,648 B2  
(45) Date of Patent: Jun. 3, 2014

(54) INTERNAL POWER SOURCE VOLTAGE GENERATING CIRCUIT OF SEMICONDUCTOR MEMORY AND METHOD FOR GENERATING INTERNAL POWER SOURCE VOLTAGE

(75) Inventor: Akihiro Hirota, Tokyo (JP)

(73) Assignee: Lapis Semiconductor Co., Ltd., Tokyo (JP)

( * ) Notice: Subject to any disclaimer, the term of this patent is extended or adjusted under 35 U.S.C. 154(b) by 252 days.

(21) Appl. No.: 13/444,893

(22) Filed: Apr. 12, 2012

(65) Prior Publication Data

US 2012/0269022 A1 Oct. 25, 2012

(30) Foreign Application Priority Data

Apr. 20, 2011 (JP) ................................. 2011-094201

(51) Int. Cl.  
*G11C 7/00* (2006.01)

(52) U.S. Cl.  
USPC .................. 365/226; 365/189.09; 365/189.11

(58) Field of Classification Search  
None  
See application file for complete search history.

(56) References Cited

U.S. PATENT DOCUMENTS

| | | | | |
|---|---|---|---|---|
| 5,592,421 | A * | 1/1997 | Kaneko et al. | 365/189.09 |
| 6,567,319 | B2 * | 5/2003 | Sato et al. | 365/189.09 |
| 7,075,357 | B2 * | 7/2006 | Koshita | 327/536 |

FOREIGN PATENT DOCUMENTS

JP 10-302492 11/1998

* cited by examiner

*Primary Examiner* — Son Dinh  
(74) *Attorney, Agent, or Firm* — Volentine & Whitt, PLLC (57) ABSTRACT

An internal power source voltage generating circuit of a semiconductor memory and a corresponding method shorten an access delay upon transition of a data reading operation in an address period shorter than a prescribed minimum period to an operation in the prescribed minimum period. While a boosted voltage of an external power source voltage is supplied to the semiconductor memory as the internal power source voltage via an output line connected to one end of a condenser. A reference low potential is applied to the other end of the condenser and the external power source voltage is applied to the output line, thereby charging the condenser. If the internal power source voltage is lower than a threshold voltage, the internal power source voltage on the output line is boosted by applying the external power source voltage to the other end of the condenser.

8 Claims, 11 Drawing Sheets

FIG. 11

INTERNAL POWER SOURCE VOLTAGE GENERATING CIRCUIT OF SEMICONDUCTOR MEMORY AND METHOD FOR GENERATING INTERNAL POWER SOURCE VOLTAGE

BACKGROUND OF THE INVENTION

1. Field of the Invention

The present invention relates to an internal power source voltage generating circuit of a semiconductor memory and a method for generating an internal power source voltage to generate an internal power source voltage so as to drive a semiconductor memory based on a power source voltage externally supplied.

2. Description of the Related Art

A flash memory as a semiconductor memory comprises memory cells arranged in a matrix, comprising EEPROM (electrically erasable programmable read only memory) capable of electrically writing and deleting data. Each memory cell comprises a stack gate transistor having a floating gate FG and a control gate CG, for example (for example, refer to FIG. 25 of Patent Literature 1). Each memory cell is capable of writing and reading data by changing a threshold voltage by means of electron injection or electron release at a floating gate FG. For example, a power source voltage supplied externally (hereafter, referred to as an external power source voltage) is applied to a control gate CG of the memory cell to read data, wherein it is determined if the read data corresponds to logical level 0 or logical level 1 depending on whether electricity flows or not.

According to a conventional flash memory, a control gate voltage to read data is set to 5 V similarly to the external power source voltage, however, as memory cells have become miniaturized and memory capacities have increased, the external power source voltages have decreased. For example, an external power source voltage of 3 V has become general.

A semiconductor integrated circuit was proposed in which a 3 V external power source voltage is boosted to 5 V in a semiconductor chip, for example, which is applied to a control gate CG of a memory cell as an internal power source voltage (for example, refer to FIG. 1 of Patent Literature 1). The semiconductor integrated circuit is provided with a boosting circuit to boost the external power source voltage so as to generate a boosted voltage, a level detecting circuit to generate a signal indicating whether the boosted voltage is lower than a reference value or not, and an internal power source voltage generating circuit to generate a voltage as an internal power source voltage in which the boosted voltage is lowered. The boosting circuit is equipped with a charge pump and oscillator (for example, refer to FIG. 2 and FIG. 3 of Patent Literature 1). The oscillator supplies an oscillation signal obtained by performing an oscillating operation to the charge pump only if the boosted voltage generated by the boosting circuit is lower than a reference value. If the boosted voltage is higher than the reference value, the oscillator stops the oscillating operation so as to supply a prescribed constant value to the charge pump. Only when the oscillation signal is supplied from the oscillator, the charge pump sequentially transfers an electric charge corresponding to the oscillation signal to each of a plurality of condensers, thereby generating a boosted voltage that is higher than the external power source voltage. According to the structure described above, the boosting circuit operates the charge pump when the boosted voltage generated by the boosting circuit itself does not reach the reference voltage, thereby raising the voltage value, whereas it stops the operation of the charge pump when the boosted voltage exceeds the reference voltage, thereby lowering the voltage value. Accordingly, the boosting circuit generates the boosted voltage in which the external power source voltage is boosted by a desired voltage value.

According to the above boosting circuit, it becomes possible to generate the boosted voltage that is higher than the external power source voltage, however, as the voltage value is increased, the amount of the current to supply decreases. In contrast, the consumption current of the memory cell increases as the address period shortens in order to access (read or write the data). Accordingly, in order to use the boosted voltage as the power source voltage of the memory, as the change period of the address is shortened, the boosted voltage value needed to be lowered, hence a minimum address period with guaranteed access was prescribed.

However, dummy reading that does not require with guaranteed access sometimes reads the data in an address period shorter than a prescribed minimum address period so as to shorten the read time. At this time, there has been a possibility that a following operational malfunction might occur immediately after dummy reading was changed to normal data reading.

Figure 1:
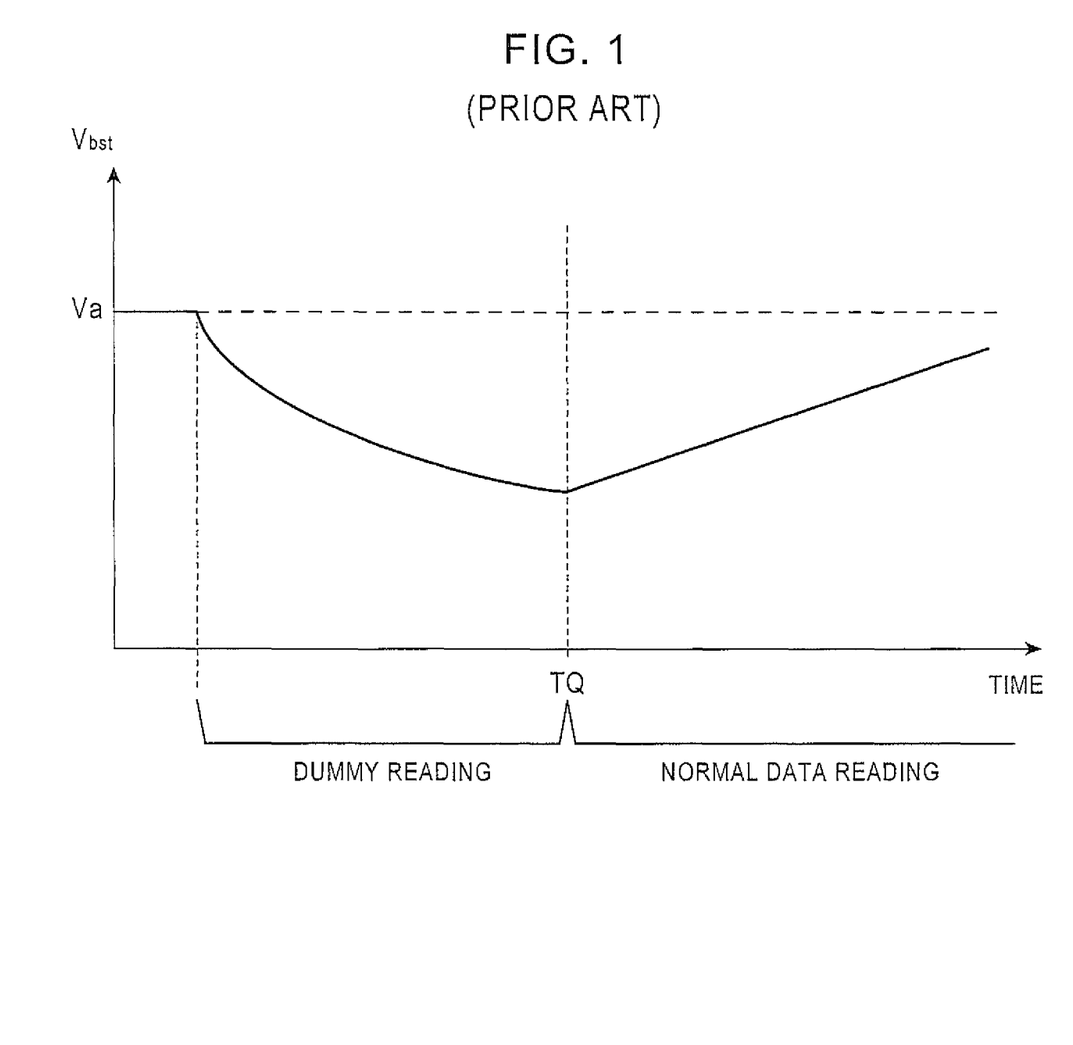
FIG. 1 is a diagram illustrating a voltage fluctuation of a boosted voltage when a dummy reading operation is changed to a normal data reading operation in a conventional semiconductor memory.

That is to say, if dummy reading is started in a period shorter than the prescribed minimum period with guaranteed access, as illustrated in FIG. 1, as the consumption current increases due to shortening of the address period, it becomes impossible that a boosted voltage Vbst generated in the boosting circuit keeps a prescribed voltage value Va, which gradually decreases. Thereafter, when the dummy reading operation is changed to a normal data reading operation at a time TQ as illustrated in FIG. 1, that is to say, when it is changed to a data reading operation in the prescribed minimum period, the boosted voltage Vbst generated in the boosting circuit gradually rises to reach the prescribed voltage value Va as the consumption current decreases due to a lengthened address period.

Therefore, even if dummy reading is changed to the normal data reading operation at the time TQ, immediately thereafter the voltage value of the boosted voltage Vbst generated in the boosting circuit has not reached the prescribed voltage value Va so as to read the data normally. Hence there has been a problem in that immediately after dummy reading is changed to the normal data reading operation, normal data reading is not performed until the voltage value of the boosted voltage Vbst reaches the prescribed voltage value Va, causing an access delay to occur.

PATENT LITERATURE

PTL 1: Japanese Patent Kokai No. H10-302492

SUMMARY OF THE INVENTION

Problem to be Solved by the Invention

An objective of the present invention is to provide an internal power source voltage generating circuit of a semiconductor memory and a method for generating an internal power source voltage, wherein an access delay can be shortened when a data reading operation in a period shorter than a prescribed minimum period with guaranteed access is changed to a data reading operation in a prescribed minimum period.

Means for Solving the Problem

The internal power source voltage generating circuit of a semiconductor memory according to the present invention is an internal power source voltage generating circuit of a semiconductor memory to generate an internal power source voltage so as to drive a semiconductor memory based on an external power source voltage in which it comprises: a first boosting part to supply a boosted voltage in which the external power source voltage is boosted to the semiconductor memory as the internal power source voltage via an output line; and a second boosting part comprising; a condenser wherein one end thereof is connected to the output line, and a boost driving control circuit wherein while a reference low potential is applied to the other end of the condenser, the external power source voltage is applied to the output line so as to perform a charging operation to charge the condenser, and if the internal power source voltage is lower than a threshold voltage, the external power source voltage is applied to the other end of the condenser, thereby raising a potential of the other end of the condenser.

The method for generating an internal power source voltage of a semiconductor memory according to the present invention is a method for generating an internal power source voltage of a semiconductor memory to generate an internal power source voltage so as to drive a semiconductor memory based on an external power source voltage in which while it boosts the external power source voltage so as to generate a boosted voltage, which is supplied to the semiconductor memory as the internal power source voltage via an output line, if the internal power source voltage is lower than the threshold voltage, depending on an address change of address data it charges the condenser wherein one end thereof is connected to the output line, and then it applies a prescribed high potential to the other end of the condenser, thereby boosting the voltage of the output line.

Effect of the Invention

According to the present invention, while an external power source voltage is boosted so as to generate an internal power source voltage having a voltage value higher than the external power source voltage, which is supplied to a semiconductor memory via an output line so as to charge a condenser wherein one end thereof is connected to the output line, an external power source voltage is applied to the other end of the condenser if the internal power source voltage is lower than the threshold voltage, thereby boosting the internal power source voltage on the output line.

Therefore, since the semiconductor memory is accessed in an address period shorter than an address period with guaranteed access due to a dummy reading operation or the like, a consumption current increases and even if an internal power source voltage value falls below a prescribed reference voltage, it becomes possible to set the internal power source voltage higher than the reference voltage. Accordingly, it becomes possible to shorten an access delay attributed to a fall of the internal power source voltage when the dummy reading operation is changed to a normal data reading operation.

DETAILED DESCRIPTION OF THE EMBODIMENT

According to the present invention, while boosting the external power source voltage so as to generate a boosted voltage, which is supplied to the semiconductor memory as the internal power source voltage via an output line, a reference low potential is applied to the other end of a condenser wherein one end thereof is connected to the output line and then an external power source voltage is applied to the output line, thereby charging the condenser, and if the internal power source voltage is lower than a threshold voltage, the external power source voltage is applied to the other end of the condenser, thereby boosting the internal power source voltage of the output line.

Embodiment

Figure 2:
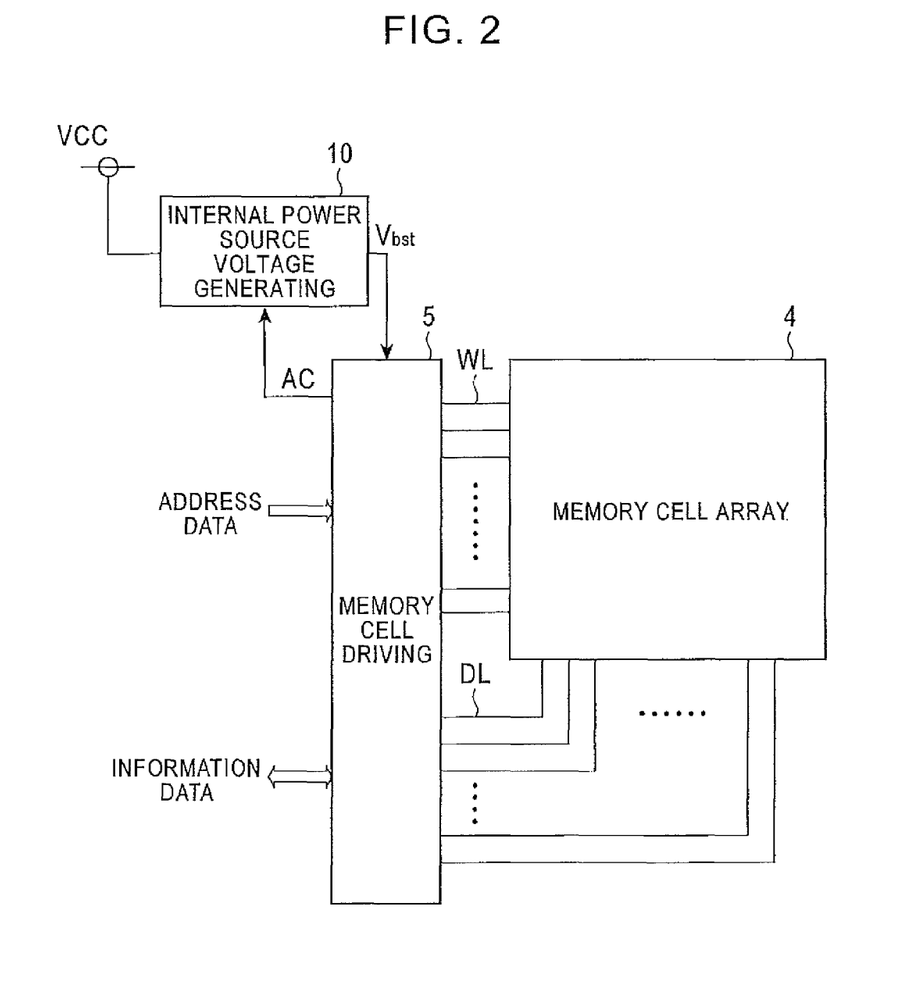
FIG. 2 is a block diagram illustrating a substantive constitution of a semiconductor memory built in a semiconductor chip.

FIG. 2 is a block diagram illustrating a substantive constitution of a semiconductor memory built in a semiconductor chip.

In FIG. 2, a memory cell array 4 having an EEPROM constitution is formed with a plurality of data lines DL and a plurality of word lines WL intersecting to each other. A memory cell (not illustrated) to memorize data is formed at an intersecting part of the data lines DL and word lines WL.

A memory cell driving part 5 decodes the address data to select a word line WL corresponding to an address indicated by the address data so as to apply a prescribed word line driving voltage to the word line WL. At this time, when performing a reading operation, the memory cell driving part 5 restores information data that is read from each memory cell based on a current sent to each data line DL so as to output it. When performing a writing operation, the memory cell driving part 5 applies a data line driving voltage corresponding to information data to write to each of a plurality of data lines DL.

Furthermore, as the address data changes as described above, the memory cell driving part 5 generates a pulsating address change signal AC that changes from logical level 0 to logical level 1 and then changes back to logical level 0 again every time the word line WL to select is switched, thereby supplying it to the internal power source voltage generating part 10.

The internal power source voltage generating part 10 generates an internal power source voltage Vbst that is higher than the external power source voltage VCC based on the external power source voltage VCC supplied from outside of the chip, thereby supplying it to the memory cell driving part 5. The memory cell driving part 5 generates a word line driving voltage and a data line driving voltage based on the internal power source voltage Vbst as described above.

Figure 3:
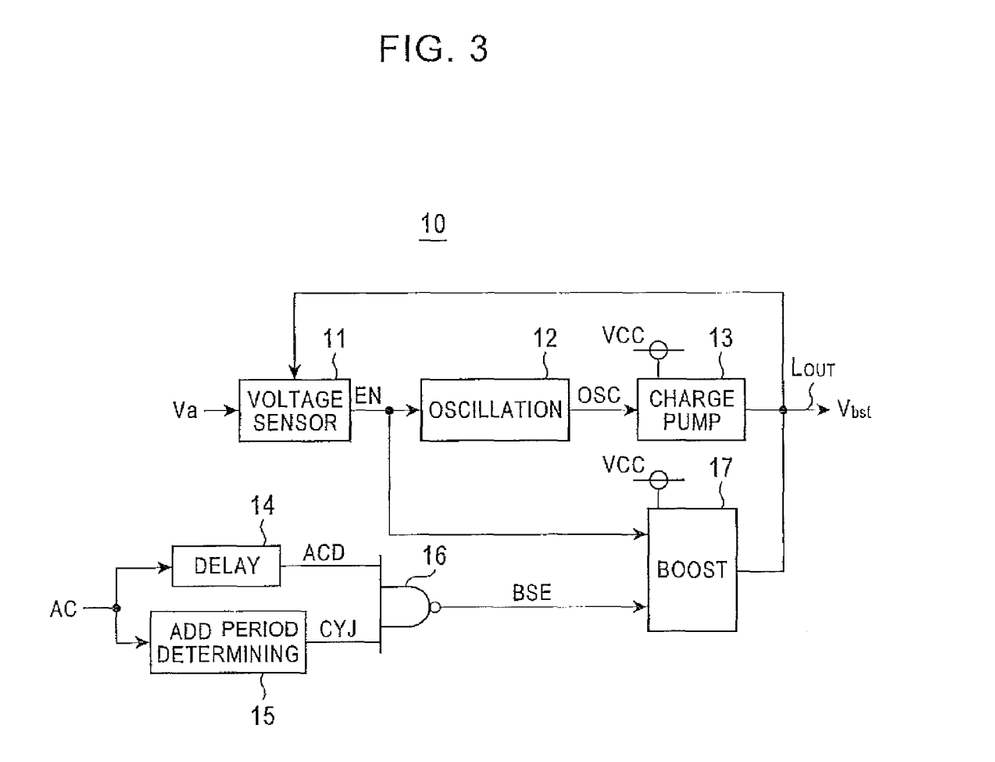
FIG. 3 is a block diagram illustrating a constitution of an internal power source voltage generating part 10.

FIG. 3 is a block diagram illustrating a constitution of an internal power source voltage generating part 10.

In FIG. 3, voltage sensor 11 compares the internal power source voltage Vbst generated on the output line Lout and the reference voltage Va that is a prescribed threshold voltage, and generates a boost enable signal EN of logical level 0 if the internal power source voltage Vbst is higher than the reference voltage Va, and generates a boost enable signal EN of logical level 1 to perform a boosting operation if the internal power source voltage Vbst is lower, thereby supplying it to the oscillating circuit 12 and boost circuit 17.

The oscillating circuit 12 performs an oscillating operation only when the boost enable signal EN is at logical level 1, thereby generating an oscillation signal OSC that alternates logical level 1 and logical level 0 for every prescribed period, thereby supplying it to the charge pump circuit 13. While the boost enable signal EN is at logical level 0, the oscillating circuit 12 stops the oscillating operation, thereby supplying a prescribed constant value to the charge pump circuit 13.

Figure 4:
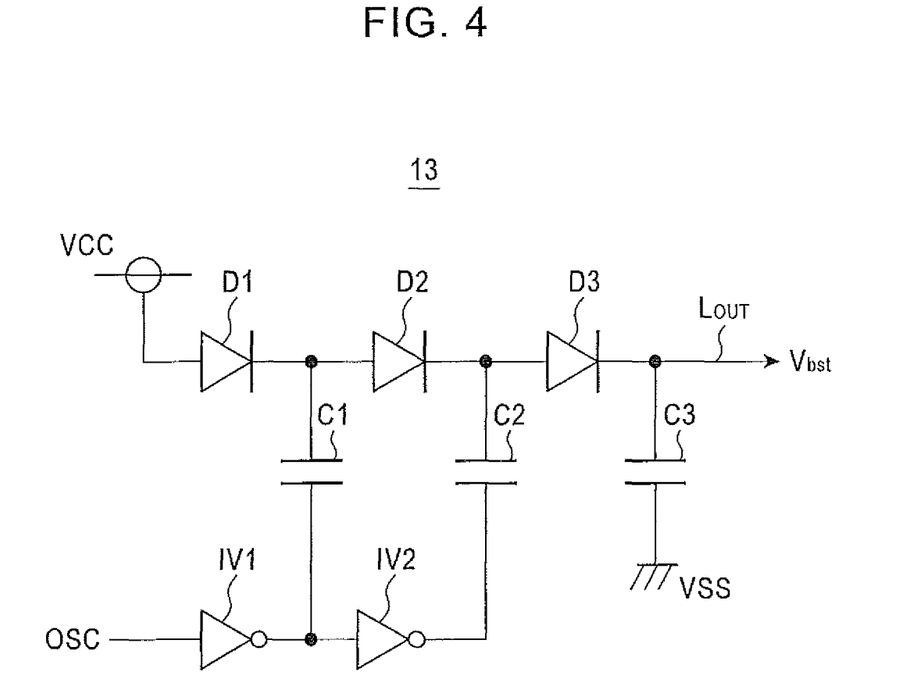
FIG. 4 is a circuit diagram illustrating a constitution of a charge pump circuit 13.

FIG. 4 is a diagram illustrating an example of an internal constitution of the charge pump circuit 13.

According to the example illustrated in FIG. 4, the charge pump circuit 13 comprises diodes D1-D3, condensers C1-C3, and inverters IV1, IV2. The diodes D1-D3 are connected in series to each other, wherein the diode D1 at the first step is provided with a fixed supply of the external power source voltage VCC. The inverter IV1 supplies a reverse oscillation signal in which the logical level of the above oscillation signal OSC is reversed to one end of the condenser C1 and the inverter IV2. The other end of the condenser C1 is connected to an output terminal of the diode D1. The inverter IV2 supplies an oscillation signal in which the logical level of the above reverse oscillation signal is reversed to one end of the condenser C2. The other end of the condenser C2 is connected to an output terminal of the diode D2. An output terminal of the diode D3 is connected to the other end of the condenser C3 that is set to a ground potential VSS (for example, 0 V) as a reference low potential. According to the constitution, an electric charge corresponding to the oscillation signal OSC supplied from the oscillating circuit 12 is sent to and accumulated in each of the condensers C1-C3 sequentially. Accordingly, the external power source voltage VCC is boosted so as to generate an internal power source boost Vbst that is higher than the VCC, which is sent to the output line Lout via the diode D3.

The delaying circuit 14 delays only the timing of a fall part of a signal level of the address change signal AC supplied from the memory cell driving part 5 by a prescribed delay time Dly3, thereby supplying it as a delay address change signal ACD to the NAND gate 16. That is to say, the delaying circuit 14 expands a pulse width WT of the address change signal AC by the delay time Dly3 so as to set it as a delay address change signal ACD.

The ADD period determining circuit 15 generates a period determining signal CYJ of logical level 1 when the pulse period of the address change signal AC is shorter than the minimum address period Tc1 with guaranteed access, and generates a period determining signal CYJ of logical level 0 if it is longer, thereby supplying it to the NAND gate 16. The ADD period determining circuit 15 uses a period that is shorter than the minimum address period Tc1 and longer than an address period that is assumed at the time of dummy reading as a threshold period (to be described below) so as to determine whether the address period to access the memory cell array 4 is shorter than the minimum address period Tc1 or not.

Figure 5:
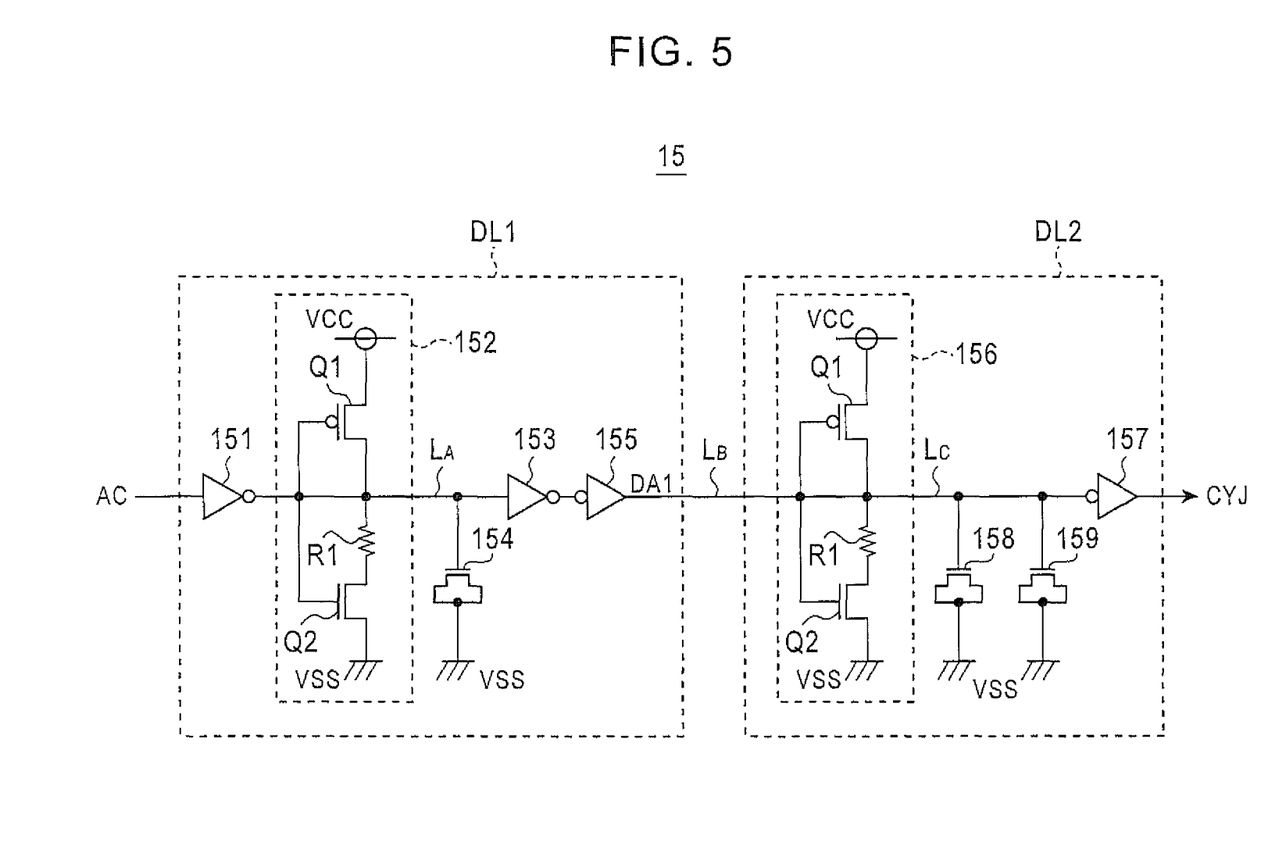
FIG. 5 is a circuit diagram illustrating a constitution of an ADD period determining circuit 15.

FIG. 5 is a circuit diagram illustrating an example of a constitution of the ADD period determining circuit 15.

As illustrated in FIG. 5, the ADD period determining circuit 15 comprises a first delay part DL1 and second delay part DL2.

An inverter 151 of the first delay part DL1 supplies a reverse address change signal supplied from the memory cell driving part 5 in which the logical level of the address change signal AC is reversed to a delay inverter 152. The delay inverter 152 is equipped with a p-channel MOS (metal oxide semiconductor) transistor Q1, n-channel MOS transistor Q2, and resistance R1. The reverse address change signal supplied from the inverter 151 is supplied to each gate terminal of the MOS transistors Q1, Q2. The source terminal of the MOS transistor Q1 is provided with a fixed supply of the external power source voltage VCC, wherein the drain terminal is connected to the drain terminal of the MOS transistor Q2 via a line $L_A$ and resistance R1. The source terminal of the MOS transistor Q2 is provided with a fixed supply of the ground potential VSS. According to the constitution, the delay inverter 152 supplies an address change signal in which the logical level of the reverse address change signal supplied from the inverter 151 is reversed to the inverter 153 via the line $L_A$. The gate terminal of the n-channel MOS transistor 154 is connected to the line $L_A$. The source terminal and drain terminal of the MOS transistor 154 is provided with a fixed supply of the ground potential VSS. That is to say, the MOS transistor 154 works as a condenser in which one end thereof is connected to the line $L_A$, whereas the other end thereof is grounded. Since the resistance R1 is disposed between the MOS transistor Q2 of the delay inverter 152 and the line $L_A$, the temporal level fluctuation in the fall part of the level of the address change signal transmitted on the line $L_A$ from the delay inverter 152 becomes moderate. The inverter 153 supplies a signal in which the logical level of the address change signal supplied via the line $L_A$ is reversed to the inverter 155. The inverter 155 sets a signal in which the logical level of the signal supplied from the inverter 153 is reversed as a first delay address change signal DA1, thereby supplying this to the second delay part DL2 at the next step via the line $L_B$.

According to the constitution, the first delay part DL1 delays the fall part of the signal level of the above address change signal AC by only a prescribed delay time Dly1 so as to output it as a first delay address change signal DA1. At this time, a sum of a pulse width WT of the address change signal AC and the delay time Dly1 becomes a threshold period (WT+Dly1) by which it is determined whether the address period to access the memory cell array 4 is shorter than the minimum address period Tc1 or not.

The delay inverter 156 of the second delay part DL2 has the same internal constitution as the above delay inverter 152 and supplies a signal in which the logical level of the first delay address change signal DA1 supplied from the first delay part DL1 is reversed to the inverter 157 via the line $L_C$. Each gate terminal of the n-channel MOS transistors 158, 159 is connected to the line $L_C$. A source terminal and drain terminal of the MOS transistors 158, 159 are provided with a fixed supply of the ground potential VSS. Therefore, each of the MOS transistors 158, 159 works as a condenser in which one end thereof is connected to the line $L_C$, whereas the other end thereof is grounded. The inverter 157 supplies a signal in which the logical level of the signal supplied from the delay inverter 156 is reversed to the NAND gate 16 illustrated in FIG. 3 as a period determining signal CYJ. According to the constitution, during a period from the rise time of the signal level of the above first delay address change signal DA1 until a time of a prescribed delay time Dly2, when the DA1 is at logical level 0, the second delay part DL2 generates a period determining signal CYJ of logical level 0 indicating that the address period Tcyc is longer than the minimum address period Tc1. The delay time Dly2 is larger than the threshold period (WT+Dly1). In contrast, after a period from the rise time of the signal level of the first delay address change signal DA1 until the time of the delay time Dly2, when the first delay address change signal DA1 remains at logical level 1, the second delay part DL2 generates a period determining signal CYJ of logical level 1 indicating that the address period Tcyc is shorter than the minimum address period Tc1.

Below, the internal operation of the ADD period determining circuit 15 constituted as illustrated in FIG. 5 will be described by referencing to FIG. 6 and FIG. 7.

Figure 6:
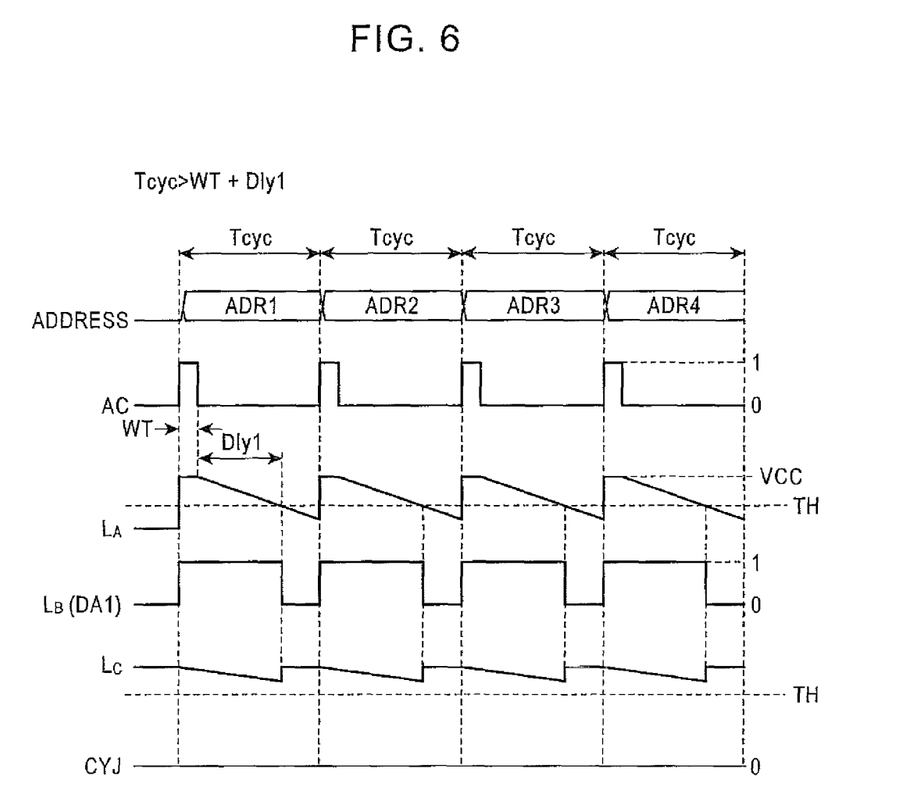
FIG. 6 is a time chart illustrating an operation of the ADD period determining circuit 15 wherein an address access period Tcyc is longer than a minimum address period Tc1 with guaranteed access.
Figure 7:
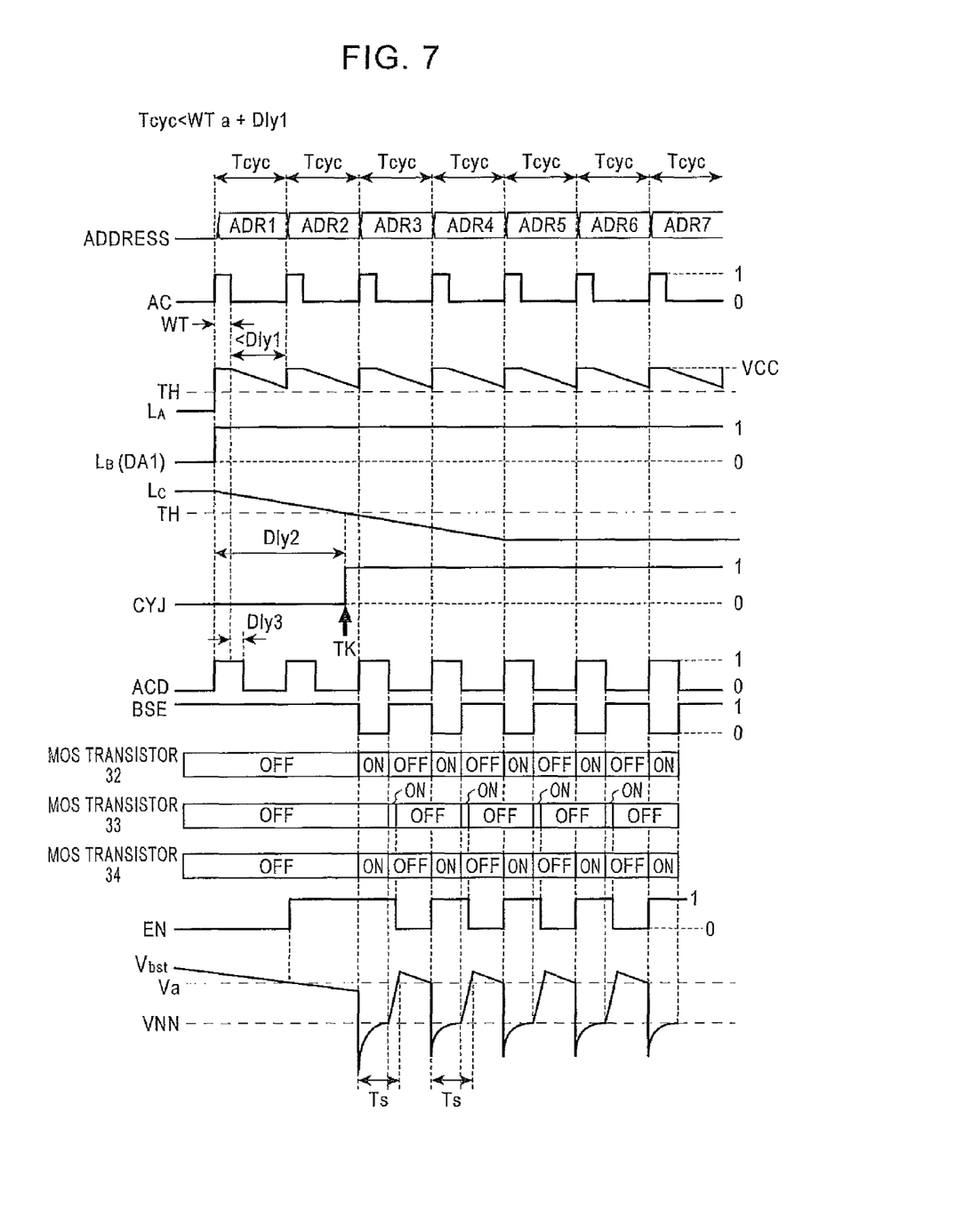
FIG. 7 is a time chart illustrating an operation of the ADD period determining circuit 15 and a boost circuit 17 wherein an address access period Tcyc is shorter than a minimum address period Tc1 with guaranteed access.

First, every time the address changes at the time of a reading operation to read the memory cell array 4, as illustrated in FIG. 6 or FIG. 7, a pulsating address change signal AC is supplied from the memory cell driving part 5. A logical reverse signal of the address change signal AC is supplied to the delay inverter 152 of the first delay part DL1. Accordingly, the delay inverter 152 of the first delay part DL1 and the MOS transistor 154 as a condenser maintain the state of the external power source voltage VCC during the pulse width WT of the address change signal AC, and thereafter transmits an address change signal in which the signal level thereof gradually lowers with a lapse of time to the line $L_A$ as illustrated in FIG. 6 or FIG. 7.

Herein, as illustrated in FIG. 6, if the address access period Tcyc is longer than the threshold period (WT+Dly1), during the address access period Tcyc from the rise time of the address change signal AC until the threshold period (WT+Dly1), the level of the address change signal on the line $L_A$ falls below the logical threshold value TH. Therefore, as illustrated in FIG. 6, the inverters 153, 155 transmit the first delay address change signal DA1 of logical level 1 to the line $L_B$ while the level of the address change signal on the line $L_A$ is larger than the logical threshold value TH, whereas it transmits that of the logical level 0 to the line $L_B$ while the level of the address change signal on the line $L_A$ is smaller than the logical threshold value TH. Corresponding to the first delay address change signal DA1, as illustrated in FIG. 6, on the line $L_C$, while the first delay address change signal DA1 is at logical level 0, a signal is transmitted such that the signal level thereof is at the external power source voltage VCC, whereas while it is at logical level 1, a signal is transmitted in which the signal level gradually lowers. As illustrated in FIG. 6, since the signal level transmitted to the line $L_C$ returns to the maximum level for every threshold period (WT+Dly1), it does not fall below the logical threshold value TH. Therefore, at this time, the inverter 157 outputs a period determining signal CYJ of logical level 0 indicating that the address access period Tcyc is longer than the minimum address period Tc1.

In contrast, as illustrated in FIG. 7, if the address access period Tcyc is shorter than the threshold period (WT+Dly1), during the address access period Tcyc, the level of the address change signal on the line $L_A$ does not fall below the logical threshold value TH. Therefore, at this time, the inverters 153, 155 transmit the first delay address change signal DA1 in which logical level 1 is fixed to the line $L_B$ as illustrated in FIG. 7. Corresponding to the first delay address change signal DA1, as illustrated in FIG. 7, on the line $L_C$, while the first delay address change signal DA1 is at logical level 1, a signal is transmitted in which the signal level is gradually lowered. At this time, at the time TK when the delay time Dly2 elapses from the rise time of the first delay address change signal DA1, the signal level on the line $L_C$ falls below the logical threshold value TH. Therefore, at this time TK, the inverter 157 outputs a period determining signal CYJ of logical level 1 indicating that the address access period Tcyc is shorter than the minimum address period Tc1 with guaranteed access.

As described above, the ADD period determining circuit 15 generates a period determining signal CYJ of logical level 0 if the address access period to access the memory cell array 4 is longer than the address period with guaranteed access, whereas it generates a period determining signal CYJ of logical level 1 if it is shorter, thereby supplying it to the NAND gate 16.

While the period determining signal CYJ is at logical level 1, that is to say, only when the address period Tcyc is shorter than the minimum address period Tc1, the NAND gate 16 supplies an reverse signal of the delay address change signal ACD in which the pulse width is expanded by the delay time Dly3 by the delaying circuit 14 to the boost circuit 17 as the boost enable signal BSE.

Figure 8:
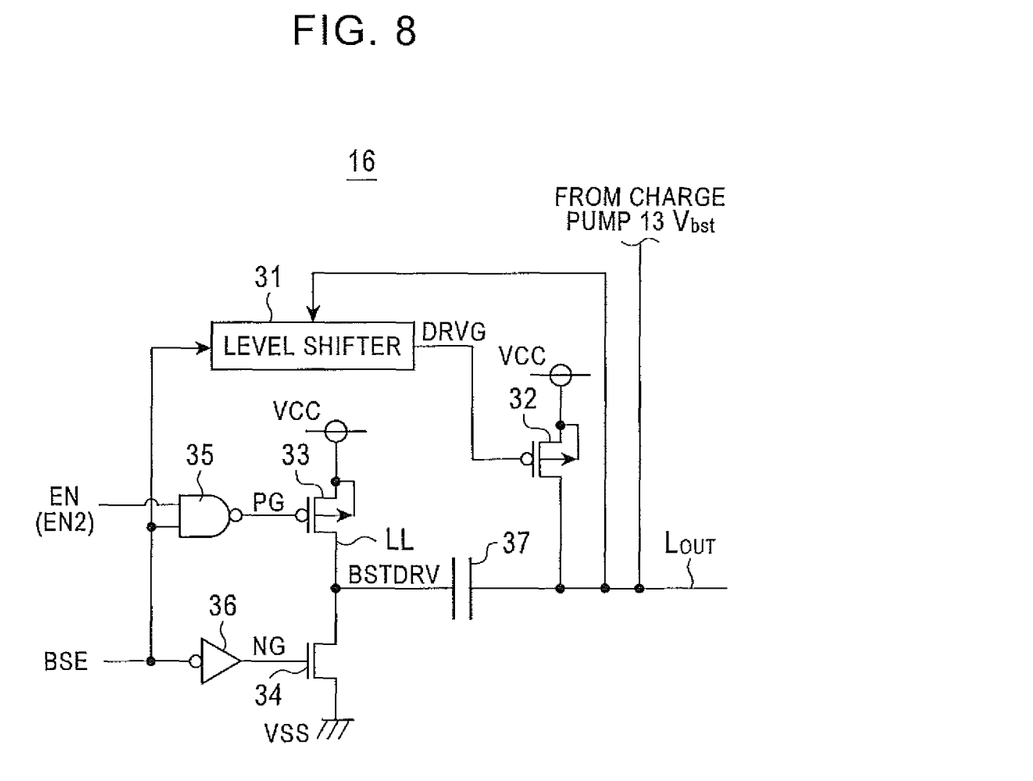
FIG. 8 is a circuit diagram illustrating a constitution of the boost circuit 17.

FIG. 8 is a diagram illustrating an example of an internal constitution of the boost circuit 17.

In FIG. 8, the NAND gate 35 supplies a logical reverse signal of a logical product of the boost enable signal EN supplied from the voltage sensor 11 and the boost enable signal BSE supplied from the NAND gate 16 to a gate terminal of the p-channel MOS transistor 33 as a charge driving signal PG. The source terminal of the MOS transistor 33 is applied with the external power source voltage VCC, wherein the drain terminal is connected to a drain terminal of the n-channel MOS transistor 34 via the line LL. The line LL is connected to the output line Lout via the condenser 37 for rapid charge. The MOS transistor 33 remains on as long as both the boost enable signal BSE and boost enable signal EN are at logical level 1, thereby applying the external power source voltage VCC to the line LL.

The source terminal of the MOS transistor 34 is set to the ground potential VSS, whereas the gate terminal is supplied with a discharge driving signal NG supplied from the inverter 36. The inverter 36 supplies a signal in which the logical level of the boost enable signal BSE is reversed to the gate terminal of the MOS transistor 34 as the above discharge driving signal NG. The MOS transistor 34 remains on only while the discharge driving signal NG is at logical level 1, thereby applying the ground potential VSS to the line LL.

The level shifter 31 supplies an output driving signal DRVG having the ground potential VSS to the gate terminal of the p-channel MOS transistor 32 while the boost enable signal BSE is at logical level 0. In contrast, the level shifter 31 supplies an output driving signal DRVG having the internal power source voltage Vbst on the output line Lout to the gate terminal of the MOS transistor 32 while the boost enable signal BSE is at logical level 1. The source terminal of the MOS transistor 32 is applied with the external power source voltage VCC, whereas the drain terminal is connected to the above output line Lout. The MOS transistor 32 remains on only while the output driving signal DRVG is at the ground potential VSS, thereby applying the external power source voltage VCC to the line LL.

Next, the operation of the internal power source voltage generating part 10 will be described as illustrated in FIG. 3.

In connection with the reading operation to read the memory cell array 4, every time the reading address changes, the memory cell driving part 5 supplies an address change signal AC having a pulse width WT as illustrated in FIG. 6 or FIG. 7 to the delaying circuit 14 and ADD period determining circuit 15 of the internal power source voltage generating part 10.

At this time, if the address access period Tcyc of the reading address based on the address change signal AC is longer than the minimum address period Tc1 with guaranteed access, that is to say, if it stays within the range of the access guarantee, a period determining signal CYJ of logical level 0 is supplied to the NAND gate 16. Corresponding to the boost enable signal BSE of logical level 1 that indicates to stop the boosting operation by the boost circuit 17, the boost circuit 17 stops the boosting operation. Accordingly, the internal power source voltage generating part 10 supplies only the internal power source voltage Vbst generated by the charge pump circuit 13 to the memory cell driving part 5 via the output line Lout.

In contrast, if the address access period Tcyc of the reading address based on the address change signal AC is shorter than the minimum address period Tc1 with guaranteed access, that is to say, if it is outside the range of the access guarantee, a period determining signal CYJ of logical level 1 is supplied to the NAND gate 16 as illustrated in FIG. 7. Accordingly, while the period determining signal CYJ is at logical level 1, as illustrated in FIG. 7, a reverse signal of the delay address change signal ACD in which the pulse width is expanded by delay time D1y3 by the delaying circuit 14 is supplied to the boost circuit 17 as the boost enable signal BSE. Herein, as illustrated in FIG. 7, while the boost enable signal BSE is at logical level 0, the MOS transistors 32, 34 of the boost circuit 17 remain on, whereas the MOS transistor 33 remains off. Accordingly, since the ground potential VSS is supplied to the condenser 37 via the line LL, when the supply is started, the internal power source voltage Vbst on the output line Lout connected to the condenser 37 rapidly falls as illustrated in FIG. 7. However, at the same time, the MOS transistor 32 is turned on in response to the output driving signal DRVG having the ground potential VSS supplied from the level shifter 31, thereby the output line Lout is pulled up by the external power source voltage VCC. Thereby, the level of the internal power source voltage Vbst on the output line Lout gradually rises as illustrated in FIG. 7 so as to reach the level of the external power source voltage VCC. During the period, the line LL is supplied with the ground potential VSS, whereas the output line Lout is supplied with the external power source voltage VCC, thereby rapidly charging the condenser 37. Thereafter when the boost enable signal BSE changes from logical level 0 to logical level 1, the MOS transistor 32 is supplied with the output driving signal DRVG having the internal power source voltage Vbst, whereas the MOS transistor 34 is supplied with the discharge driving signal NG of logical level 0. Thereby, the MOS transistors 32, 34 are turned off. Thereafter, since the internal power source voltage Vbst falls below the prescribed reference voltage Va, the boost enable signal EN of logical level 1 to cause it to perform the boosting operation, wherein corresponding to the charge driving signal PG of logical level 0, the MOS transistor 33 is turned on so as to apply the external power source voltage VCC to the line LL. By applying the external power source voltage VCC to the other end of the condenser 37 in which one end thereof is connected to the output line Lout, the level of the internal power source voltage Vbst is raised on the output line Lout connected to one end of the condenser 37 so as to save the electric charge that was charged in advance. When the address is changed, that is to say, after a lapse of the period Ts from the rise time of the level of the delay address change signal AC, it exceeds the above reference value Va. As illustrated in FIG. 7, the pulse width (WT+Dly3) of the delay address change signal ACD is set to be long enough to access the address of a normal reading operation, and a period wherein condenser 37 is sufficiently charged by setting the MOS transistors 32, 34 on.

As described above, in the internal power source voltage generating part 10 as illustrated in FIG. 3, the charge pump circuit 13 boosts the external power source voltage VCC so as to send the internal power source voltage Vbst that is higher than the VCC via the output line Lout, wherein first the address period Tcyc to access the memory cell array 4 is determined whether it is shorter than the minimum address period Tc1 with guaranteed access or not. At this time, if the address period Tcyc is determined to be shorter than the minimum address period Tc1, the boost circuit 17 is caused to operate so as to boost the voltage value of the internal power source voltage Vbst as follows. That is to say, first, corresponding to the address change, the MOS transistors 32, 34 are kept on during the prescribed period (WT+Dly3), thereby rapidly charging the condenser 37. This rapid charge gradually raises the voltage value of the internal power source voltage Vbst so as to reach the external power source voltage VCC. After a lapse of the prescribed period (WT+Dly3), if the voltage value of the internal power source voltage Vbst is lower than the reference voltage value Va, the MOS transistor 33 is turned on. This applies the external power source voltage VCC to the other end of the condenser 37 in which one end thereof is connected to the output line Lout, thereby further raising the voltage value of the internal power source voltage Vbst on the output line Lout connected to one end of the condenser 37 so as to save the electric charge that was charged in advance so as to cause it to reach the voltage higher than the reference voltage value Va.

Therefore, since the memory cell array is accessed in an address period shorter than an address period with guaranteed access due to a dummy reading operation or the like, the consumption current is increased, even if the voltage value of the internal power source voltage Vbst falls below the prescribed reference voltage Va, it becomes possible to set the voltage value of the internal power source voltage Vbst higher than the reference voltage Va. Accordingly, it becomes possible to shorten the access delay attributed to a fall of the internal power source voltage when the dummy reading operation is changed to the normal data reading operation.

According to the above embodiment, the boost circuit 17 is switched to operate or not to operate depending on whether the address period Tcyc to access the memory cell array 4 is shorter than the minimum address period Tc1 with guaranteed access or not, however, it is acceptable to switch based on the voltage value of the internal power source voltage Vbst.

Figure 9:
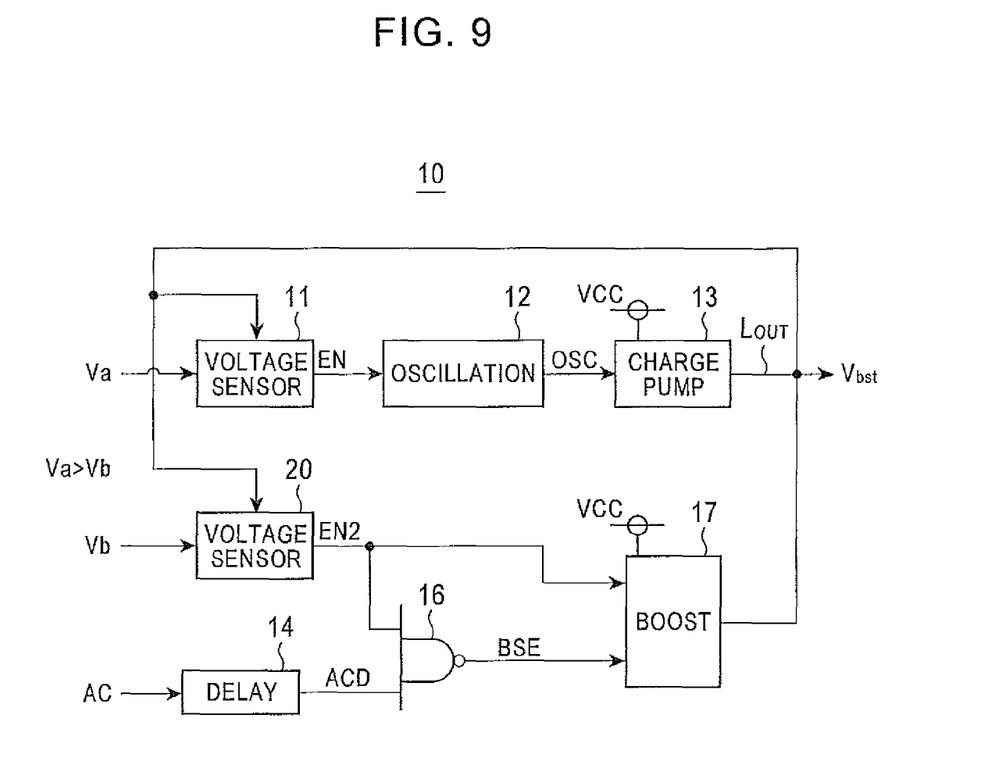
FIG. 9 is a block diagram illustrating a modification example of the internal power source voltage generating part 10.

FIG. 9 is a block diagram illustrating other internal constitution of the internal power source voltage generating part 10 formed in light of the above point.

With regard to the constitution illustrated in FIG. 9, excluding the ADD period determining circuit 15 of the internal power source voltage generating part 10 illustrated in FIG. 3, the operation of other function modules is the same as the one illustrated in FIG. 3 excluding the fact that the voltage sensor 20 is added. That is to say, according to the constitution illustrated in FIG. 9, instead of the period determining signal CYJ transmitted from the ADD period determining circuit 15, the boost enable signal EN2 transmitted from the voltage sensor 20 is supplied to the NAND gate 16, and instead of the boost enable signal EN transmitted from the voltage sensor 11, the boost enable signal EN2 is supplied to the boost circuit 17.

At this time, voltage sensor 20 compares the internal power source voltage Vbst generated on the output line Lout and the reference voltage Va as the threshold voltage, and then generates a boost enable signal EN2 of logical level 0 if the internal power source voltage Vbst is higher than the reference voltage Vb, and generates a boost enable signal EN2 of logical level 1 to perform a boosting operation if the internal power source voltage Vbst is lower, thereby supplying it to the NAND gate 16 and boost circuit 17. The reference voltage Vb is lower than the reference voltage Va described above.

Figure 10:
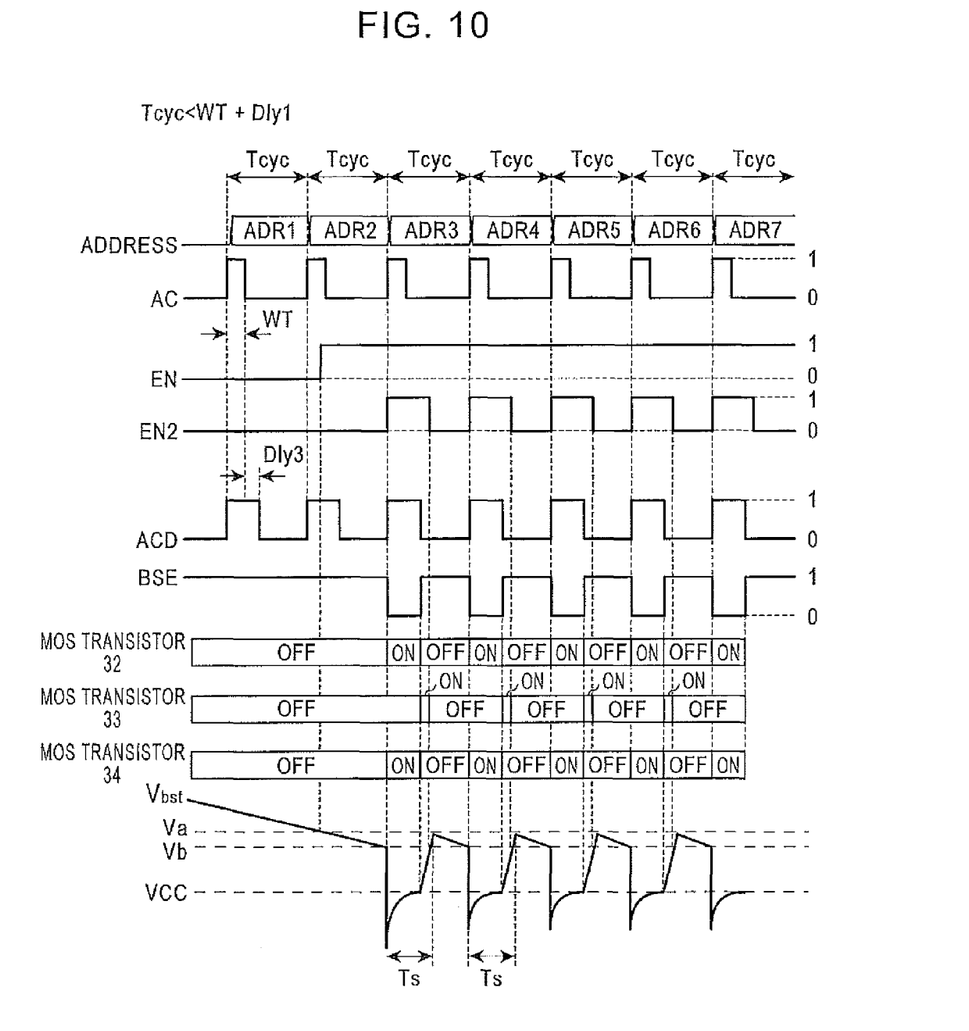
FIG. 10 is a time chart illustrating an operation of the internal power source voltage generating part 10 illustrated in FIG. 9 wherein an address access period Tcyc is shorter than a minimum address period Tc1 with guaranteed access.

According to the constitution illustrated in FIG. 9, as illustrated in FIG. 10, if the internal power source voltage Vbst is higher than the reference voltage Vb, the logical level becomes 1, whereas if it is lower, a signal in which the logical level of the delay address change signal ACD is reversed is supplied to the boost circuit 17 as the boost enable signal BSE. At this time, as illustrated in FIG. 10, while the boost enable signal BSE remains at logical level 0, the MOS transistors 32, 34 of the boost circuit 17 is turned on, whereas the MOS transistor 33 is turned off. Accordingly, since the ground potential VSS is supplied to the other end of the condenser 37 in which one end thereof is connected to the output line Lout, when the supply is started, the internal power source voltage Vbst on the output line Lout connected to one end of the condenser 37 rapidly falls as illustrated in FIG. 10. However, at the same time, the MOS transistor 32 is turned on in response to the output driving signal DRVG having the ground potential VSS supplied from the level shifter 31, wherein the output line Lout is pulled up by the external power source voltage VCC. Thereby, the level of the internal power source voltage Vbst on the output line Lout gradually rises as illustrated in FIG. 10 so as to reach the level of the external power source voltage VCC. During the period, the line LL is supplied with the ground potential VSS, whereas the output line Lout is supplied with the external power source voltage VCC, thereby rapidly charging the condenser 37. Thereafter when the boost enable signal BSE changes from logical level 0 to logical level 1, the MOS transistor 32 is supplied with the output driving signal DRVG having the internal power source voltage Vbst, whereas the MOS transistor 34 is supplied with a discharge driving signal NG of logical level 0. Thereby, the MOS transistors 32, 34 are turned off. Thereafter, corresponding to the boost enable signal EN2 that is at logical level 1 since the internal power source voltage Vbst falls below the reference voltage Vb, the MOS transistor 33 is turned on, thereby applying the external power source voltage VCC to the line LL. Accordingly, the external power source voltage VCC is applied to the other end of the condenser 37, the level of the internal power source voltage Vbst is raised on the output line Lout connected to one end of the condenser 37 so as to save the electric charge that was charged in advance, wherein when the address is changed, that is to say, after a lapse of the period Ts from the rise time of the level of the delay address change signal AC, it exceeds the above reference value Vb.

As described above, when the constitution illustrated in FIG. 9 is employed as the internal power source voltage generating part 10, regardless of the address period Tcyc, the condenser 37 of the boost circuit 17 is rapidly charged so as to raise the level of the internal power source voltage Vbst if the internal power source voltage Vbst is lower than the prescribed reference voltage Vb (Vb<Va). Therefore, compared to a case in which the constitution illustrated in FIG. 3 is employed wherein the condenser 37 is not charged unless the delay time Dly2 is elapsed as illustrated in FIG. 7 after the address period Tcyc becomes shorter than the access guarantee period, the boosting operation by the boost circuit 17 responds faster. That is to say, according to the constitution illustrated in FIG. 9, even if the internal power source voltage Vbst falls below the reference voltage Vb before the delay time Dly2 elapses from the time of address change since the address period Tcyc is shorter than the access guarantee period, it becomes possible to start the boosting operation by the boost circuit 17.

According to the constitution illustrated in FIG. 9, the boost enable signal EN2 transmitted from the voltage sensor 20 is supplied to the boost circuit 17, however, it is acceptable to supply the boost enable signal EN transmitted from the voltage sensor 11 to the boost circuit 17 instead of the boost enable signal EN2. Accordingly, the condenser 37 starts charging the boosting operation of the boost circuit 17 when the internal power source voltage Vbst falls below the reference voltage Va.

Figure 11:
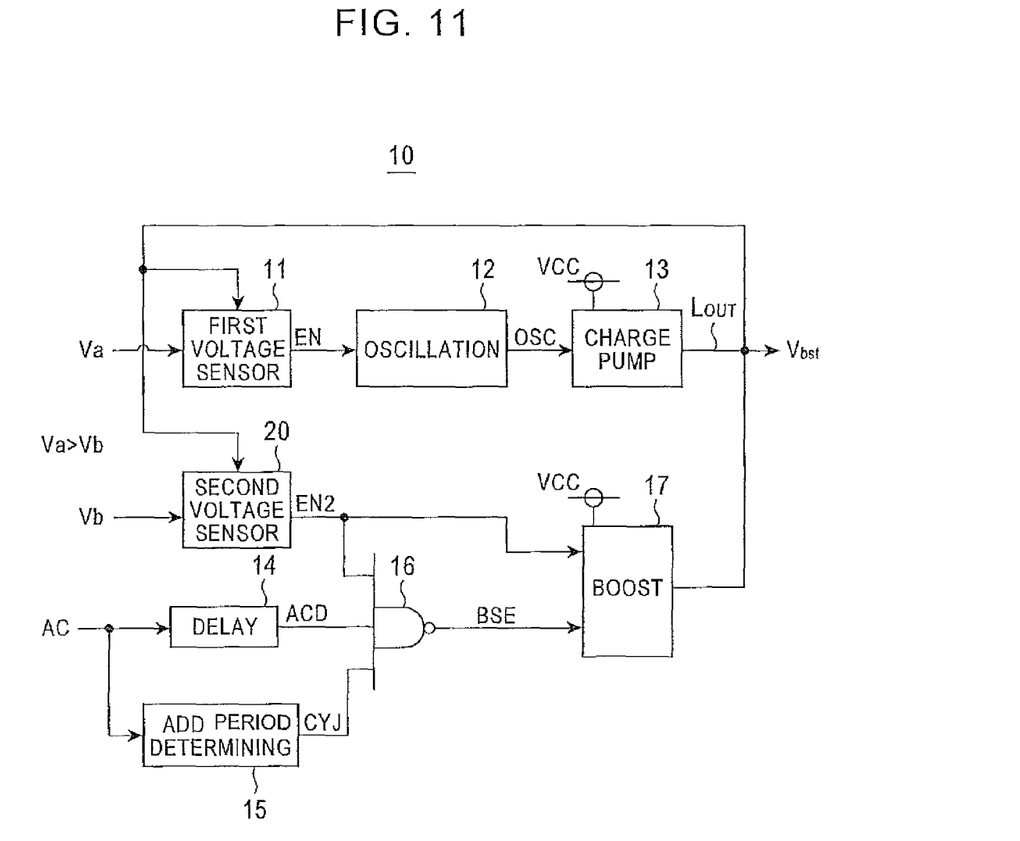
FIG. 11 is a block diagram illustrating a modification example of the internal power source voltage generating part 10.

As the internal power source voltage generating part 10, it is acceptable to employ the constitution illustrated in FIG. 11 in which the constitutions illustrated in FIG. 3 and FIG. 9 are used together. In short, the internal power source voltage generating part 10 illustrated in FIG. 11 is based on the constitution illustrated in FIG. 9 to which the ADD period determining circuit 15 illustrated in FIG. 3 is added such that the period determining signal CYJ transmitted from the ADD period determining circuit 15 is supplied to the NAND gate 16. According to the constitution, the condenser 37 starts charging only when the internal power source voltage Vbst is at or smaller than the reference voltage Vb, and when the address period Tcyc satisfies the following:

$$Tcyc < WT + Dly1$$

Moreover, according to the above embodiment, depending on whether the address period Tcyc is shorter than the minimum address period Tel with guaranteed access or not, and/or whether the internal power source voltage Vbst is below the reference voltage Vb or not, the boost circuit 17 is controlled to perform the boosting operation or not, however, it is acceptable to operate the boost circuit 17 all the time.

In short, while the first boosting part (oscillating circuit 12, charge pump 13) is used to boost the external power source voltage so as to generate the internal power source voltage (Vbst), which is supplied to the memory cell driving part (5) via the output line (Lout), the second boosting part (boost circuit 17) is used to perform the following boosting operation. That is to say, while the boost driving control circuit (MOS transistor 32-34) of the second boosting part is used such that the reference low potential (VSS) is applied to the other end of the condenser (37) in which one end thereof is connected to the output line, the external power source voltage (VCC) is applied to the output line, thereby charging the condenser. If the internal power source voltage is lower than the threshold voltages (Va, Vb), the external power source voltage is applied to the other end of the condenser, thereby boosting the internal power source voltage on the output line.

This application is based on Japanese Patent Application No. 2011-094201 which is incorporated herein by reference.

What is claimed is:

1. An internal power source voltage generating circuit of a semiconductor memory to generate an internal power source voltage so as to drive a semiconductor memory based on an external power source voltage, comprising:

a first boosting part to supply a boosted voltage in which the external power source voltage is boosted to the semiconductor memory as the internal power source voltage via an output line; and a second boosting part comprising a condenser having one end connected to the output line, and a boost driving control circuit wherein while a reference low potential is applied to the other end of the condenser, the external power source voltage is applied to the output line so as to perform a charging operation to charge the condenser, and if the internal power source voltage is lower than a threshold voltage, the external power source voltage is applied to the other end of the condenser, thereby raising a potential of the other end of the condenser.

2. The internal power source voltage generating circuit of a semiconductor memory recited in claim 1, further comprising an address period determining part to determine whether a period of an address change of address data supplied to the semiconductor memory is shorter than a threshold period or not, wherein the boost driving control circuit performs the charging operation if the address period determining part determines that the period of the address change is shorter than the threshold period.

3. The internal power source voltage generating circuit of a semiconductor memory recited in claim 2 wherein the boost driving control circuit performs the charging operation if the address period determining part determines that the period of the address change is shorter than the threshold period and the internal power source voltage is lower than the threshold voltage.

4. The internal power source voltage generating circuit of a semiconductor memory recited in claim 3 wherein the first boosting part generates the boosted voltage if the internal power source voltage is lower than a second threshold voltage that is higher than the threshold voltage.

5. The internal power source voltage generating circuit of a semiconductor memory re cited in claim 2 wherein the first boosting part generates the boosted voltage if the internal power source voltage is lower than the threshold voltage.

6. The internal power source voltage generating circuit of a semiconductor memory cited in claim 1 characterized in that the boost driving control circuit performs the charging operation if the internal power source voltage is lower than the threshold voltage.

7. The internal power source voltage generating circuit of a semiconductor memory cited in claim 6 wherein the first boosting part generates the boosted voltage if the internal power source voltage is lower than a second threshold voltage that is higher than the threshold voltage.

8. A method for generating an internal power source voltage of a semiconductor memory to generate an internal power source voltage so as to drive a semiconductor memory based on an external power source voltage, wherein while it boosts the external power source voltage so as to generate a boosted voltage, which is supplied to the semiconductor memory as the internal power source voltage via an output line, if the internal power source voltage is lower than the threshold voltage, depending on an address change of address data it charges the condenser wherein one end thereof is connected to the output line, and then it applies a prescribed high potential to the other end of the condenser, thereby boosting the voltage on the output line.

\* \* \* \* \*